(12) United States Patent
Meng

(10) Patent No.: US 12,099,082 B2
(45) Date of Patent: Sep. 24, 2024

(54) SYSTEMS AND METHODS FOR CONDUCTING VEHICLE OSCILLATOR TESTING

(71) Applicant: TOYOTA MOTOR ENGINEERING & MANUFACTURING NORTH AMERICA, INC., Plano, TX (US)

(72) Inventor: Ming M. Meng, Novi, MI (US)

(73) Assignee: TOYOTA MOTOR ENGINEERING & MANUFACTURING NORTH AMERICA, INC., Plano, TX (US)

(*) Notice: Subject to any disclaimer, the term of this patent is extended or adjusted under 35 U.S.C. 154(b) by 626 days.

(21) Appl. No.: 17/367,180

(22) Filed: Jul. 2, 2021

(65) Prior Publication Data
US 2023/0003783 A1   Jan. 5, 2023

(51) Int. Cl.
| | | |
|---|---|---|
| *G01R 31/00* | (2006.01) | |
| *B60R 25/24* | (2013.01) | |
| *G01R 31/28* | (2006.01) | |
| *G07C 5/08* | (2006.01) | |
| *H04W 4/80* | (2018.01) | |
| *H04W 24/00* | (2009.01) | |

(52) U.S. Cl.
CPC .......... *G01R 31/007* (2013.01); *B60R 25/245* (2013.01); *G01R 31/2822* (2013.01); *G01R 31/2824* (2013.01); *G07C 5/0808* (2013.01); *G07C 5/085* (2013.01); *H04W 4/80* (2018.02); *H04W 24/00* (2013.01)

(58) Field of Classification Search
CPC ........ B60R 25/24; B60R 25/245; H04W 4/80; H04W 24/02; H04W 24/00; G01R 31/007; G01R 31/2822; G01R 31/2824
See application file for complete search history.

(56) References Cited

U.S. PATENT DOCUMENTS

| | | | |
|---|---|---|---|
| 10,257,730 B1 * | 4/2019 | Van Wiemeersch | .... H04W 4/48 |
| 10,298,239 B2 | 5/2019 | Obata et al. | |
| 10,771,013 B2 * | 9/2020 | Ito | .......... H03B 5/366 |
| 10,784,817 B2 | 9/2020 | Ito | |
| 10,857,976 B2 | 12/2020 | Kusumoto et al. | |
| 10,926,738 B1 * | 2/2021 | Tucci | .................... B60R 25/245 |

FOREIGN PATENT DOCUMENTS

| | | |
|---|---|---|
| KR | 101908132 B1 | 12/2018 |
| WO | 2016063717 A1 | 4/2016 |

\* cited by examiner

*Primary Examiner* — Ryan Johnson
(74) *Attorney, Agent, or Firm* — Dinsmore & Shohl LLP

(57) ABSTRACT

A testing system includes a testing device including a display screen. The testing device can display, via the display screen, a representation of a vehicle and oscillators of the vehicle. The testing device transmits a test request that identifies a selected oscillator of the plurality of oscillators for testing. A vehicle receives the test request. An electronic control unit of the vehicle instructs the selected oscillator to generate test signals. The testing calculates a performance metric of the test signals. The testing device determines whether the selected oscillator is properly placed, functioning at a predetermined threshold, or both. Improperly placed or improperly functioning oscillators can be adjusted or replaced.

20 Claims, 4 Drawing Sheets

SYSTEMS AND METHODS FOR CONDUCTING VEHICLE OSCILLATOR TESTING

TECHNICAL FIELD

The present disclosure generally relates to vehicle oscillator testing and, more specifically, to a testing system that utilizes a testing device to determine whether oscillators are functioning according to a desired operation.

BACKGROUND

Vehicles, such as automobiles, can include sensors containing oscillators that are placed at various locations on or in the vehicle and used for a wide variety of purposes, such as, for example, communicating with electronic devices that are separate from the vehicle, such as key fobs or remote controllers. The oscillator containing sensors receive signals from the electronic devices, which is then used to elicit a response by the vehicle such as, for example, unlocking a door, actuating the vehicle ignition, and/or the like. When an oscillator within a sensor fails to function as expected, operations of a vehicle become limited. Users can become frustrated and a vehicle may need to be repaired. Accordingly, it becomes necessary to optimize or improve testing of the sensor components, including the oscillators.

SUMMARY

In one aspect, a testing device, includes a processor configured to display, via a display screen, a representation of a vehicle and a plurality of oscillators of the vehicle. The processor is further configured to transmit a test request that identifies a selected oscillator of the plurality of oscillators for testing in response to receiving an input via the display screen. The processor may further calculate a performance metric of test signals received from the selected oscillator to determine whether the selected oscillator is at least one of properly placed and functioning at a predetermined threshold.

In another aspect, a method includes displaying, via a display screen, a graphical representation of a vehicle and a graphical representation of a plurality of oscillators of the vehicle, and transmit a test request that identifies a selected oscillator of the plurality of oscillators in response to receiving input selecting the selected oscillator. The method may further include instructing, via an electronic control unit of the vehicle, the selected oscillator to transmit a test signal and calculating a performance metric of the test signal transmitted by the selected oscillator to determine whether the selected oscillator is at least one of properly placed and functioning at a predetermined threshold.

In yet another aspect, a testing system includes a testing device, configured to display, via a display screen, a representation of a vehicle and a plurality of oscillators of the vehicle, and transmit a test request that identifies a selected oscillator of the plurality of oscillators for testing in response to receiving input via the display screen. The testing system further includes a vehicle comprising a communication unit communicatively coupled to an electronic control unit, wherein the electronic control unit is configured to receive, via the communication unit, the test request, and instruct the selected oscillator to generate test signals. The testing device is further configured to calculate a performance metric of the test signals received from the selected oscillator to determine whether the selected oscillator is at least one of properly placed, functioning at a predetermined threshold, or both.

These and additional objects and advantages provided by the aspects and embodiments described herein will be more fully understood in view of the following detailed description, in conjunction with the drawings.

BRIEF DESCRIPTION OF THE DRAWINGS

The aspects and embodiments set forth in the drawings are illustrative and exemplary in nature and not intended to limit the subject matter defined by the claims. The following detailed description of the illustrative aspects and embodiments can be understood when read in conjunction with the following drawings, where like structure is indicated with like reference numerals and in which:

DETAILED DESCRIPTION

The systems and methods described herein generally relate to testing of low frequency oscillator devices of vehicles. In particular, embodiments utilize a testing device executing an application that provides a testing platform for sensors of a vehicle that include oscillators. The application instructs the testing device to display a representation of a vehicle and a plurality of oscillators of the vehicle on a display screen. A user can select one or more oscillators for testing and the testing device can transmit a test request that identifies the one or more selected oscillators of the plurality of oscillators for testing. An electronic control unit of a vehicle can receive a test request and can instruct the one or more oscillators to generate test signals to be received by the testing device. The testing device can calculate a performance metric of the test signals received from one or more oscillators. Based on the performance metric, the testing device can determine whether the one or more oscillators are properly placed, functioning at a predetermined threshold, or both.

Accordingly, described embodiments allow for analysis of placement of oscillators and functionality of oscillators within vehicles. Analysis of test signals can identify whether oscillators will functionally communicate with key fobs or other wireless devices.

Figure 1:
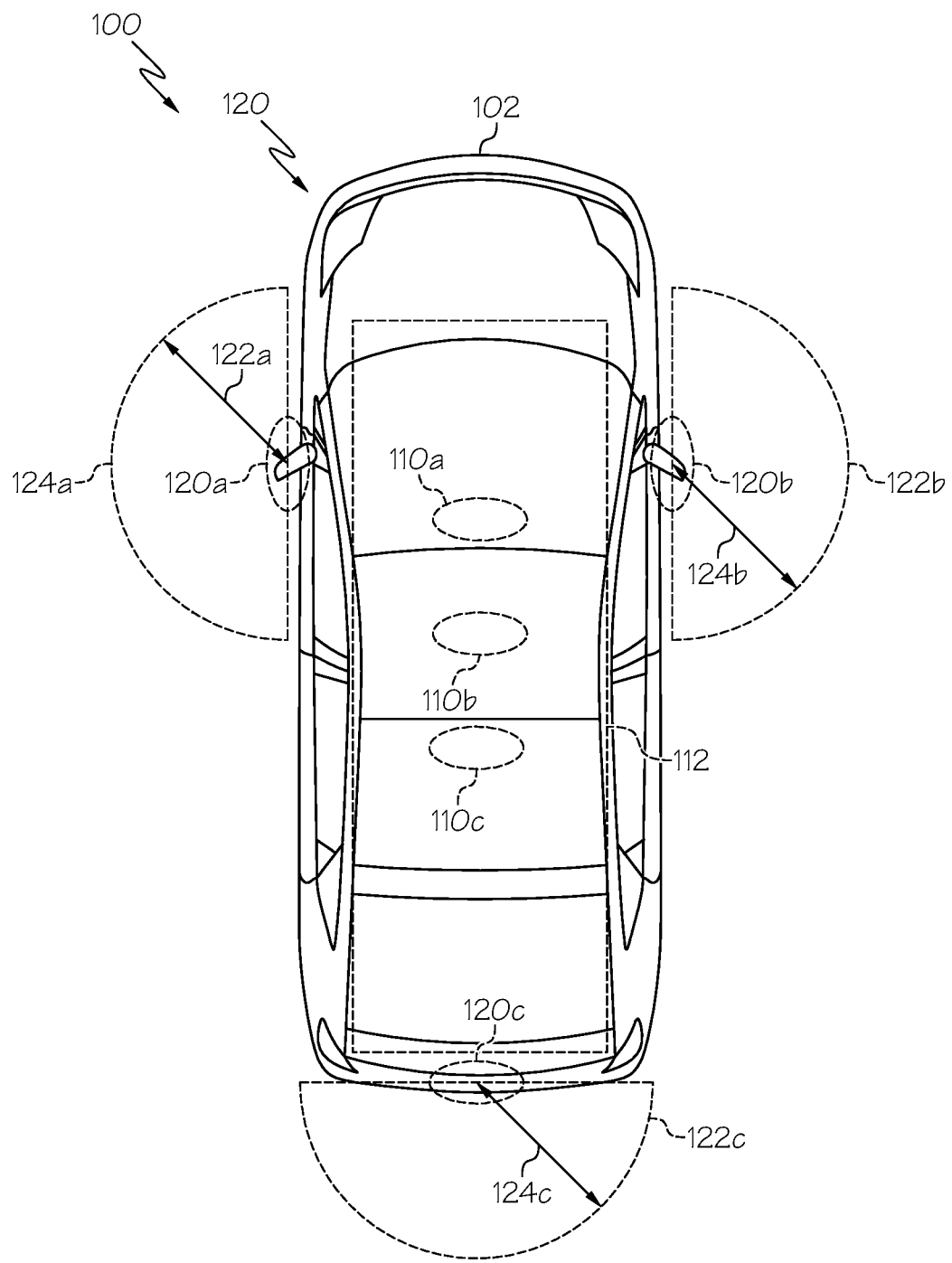
FIG. 1 schematically depicts a portion of a testing system for testing of a plurality of oscillators for a vehicle according to one or more aspects shown and described herein.

As shown and described herein, systems and methods for testing oscillators of a vehicle are provided. Turning now to the drawings wherein like numbers refer to like structures, and particularly to FIG. 1, schematically depicts a view of a portion of a testing system 100 for testing of a plurality of oscillators for a vehicle 102. Testing of oscillators may allow for determinations as to whether oscillators are placed in proper locations, appropriately oriented, and/or are appropriately functioning. Moreover, embodiments may determine modifications to be made to oscillator positions and/or orientations.

Figure 2:
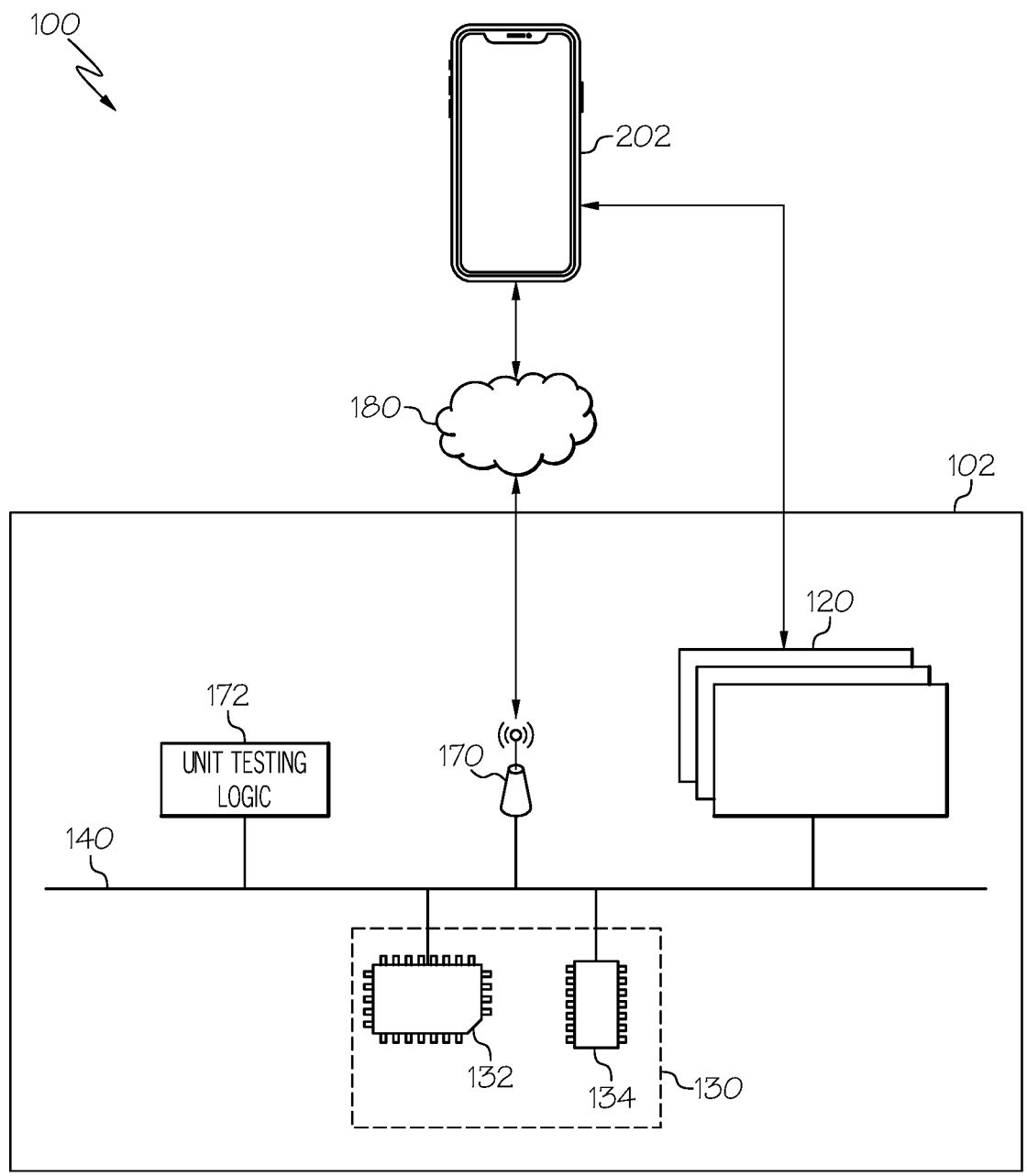
FIG. 2 schematically depicts a testing system including a testing device and a portion of a vehicle according to one or more aspects shown and described herein.

In an embodiment, the vehicle 102 may include a plurality of sensors, each comprising one or more oscillators. The oscillators may include one more cabin oscillators, such as oscillators 110a, 110b, and 110c, and one or more door oscillators, such as door oscillators 120a, 120b, and 120c. The oscillators 110a-c and 120a-c may be communicatively coupled to a communication bus 140 (FIG. 2). Each oscillator 110a-110c and/or 120a-120c may include or be coupled with a wireless receiver, such as an antenna. In some embodiments, the oscillators 110a-110c and/or 120a-120c may include transceivers that may include an oscillator, an antenna, a transmitter, a receiver, and an electronic controller, such as a processor and a data storage device. Components of a transceiver may be provided in an integrated circuit. The transceiver may include a radio frequency (RF) transceiver that can perform predetermined process such as amplification or demodulation on received radio waves or to generate radio waves to be transmitted.

In embodiments, the oscillators 110a-110c and/or 120a-120c may be configured to generate and/or receive signals in a predetermined frequency or frequency range, for example, a signal generally at a frequency at or between 100-250 KHz, 120-135 KHz, or the like. The oscillators 110a-110c and/or 120a-120c may further perform amplification or demodulation on the received signals received through associated antennas. For example, and without limitation, the oscillators 110a-110c and/or 120a-120c may include wireless communication devices, such as transceivers, receivers, and/or transmitters, that are capable of generating and/or receiving signals. Each of oscillators 110a-110c and/or 120a-120c may be utilized as key fob sensors, wireless device sensors, or the like. It is noted that the end use of the plurality of oscillators 120 is not limited. That is, the plurality of oscillators 120 may be tested for functionality regardless of how the oscillators 110a-110c and/or 120a-120c are to be used once a vehicle is produced or otherwise released for production. Signals generated by, for example, oscillators 110a-110c and/or 120a-120c may be communicated to key fobs, remote controllers, computing devices, or other devices. The oscillators 110a-110c and/or 120a-120c may be associated with respective coverage areas. For instance, oscillator 120a may include predetermined coverage area 124a, generally defined by a coverage radius 122a. Similarly, oscillator 120b may include predetermined coverage area 124b, generally defined by a coverage radius 122b, and oscillator 120c may include predetermined coverage area 124c, generally defined by a coverage radius 122c. The cabin oscillators 110a, 110b, and 110c may have a collective coverage area 112, where at least one of the cabin oscillators 110a, 110b, and 110c provides coverage to each location within the coverage area 112. For instance, the cabin oscillator 110a may provide coverage within the area of a dash or counsel, and/or a driver and front passenger seat. Cabin oscillator 110a may at least partially provide overlapping coverage with cabin oscillator 110b. Cabin oscillator 110b may generally provide coverage at or behind the driver and front passenger seat, at a second and/or third row of seats, or the like. Cabin oscillator 110b may in turn at least partially provide overlapping coverage with cabin oscillator 110c. Cabin oscillator 110c may generally provide coverage at or behind a second and/or third row of seats, within a cargo area, or the like. As such, cabin oscillators 110a, 110b, and 110c may include overlapping coverage areas such that the collective coverage area 112 is fully covered by at least one of cabin oscillators 110a, 110b, and 110c. The coverage areas for the respective oscillators 110a-110c and/or 120a-120c may comprise predetermined areas in which the respective oscillators 110a-110c and/or 120a-120c are configured to generate wireless signals detectable by another device, such as a key fob, computing device, or other device. The coverage areas can be controlled by oscillators 110a-110c and/or 120a-120c. For instance, each oscillator may be disposed in a particular location and at a particular orientation such that signals generated at a predetermined strength by the oscillator are transmitted over the coverage area. In an example, the coverage area for oscillator 110a may include a front cabin of a vehicle, such between a windshield and a plane defined by a driver and front passenger seat. In this example coverage area, the oscillator of the oscillator 110a selectively generates and emits wireless signals that may be received by a key fob, computing device or other device may sense signals emitted by the oscillator 110a. If the oscillator of the oscillator 110a is improperly placed, oriented, or otherwise not functioning as expected, the coverage area may shift or become unreliable such that key fobs, computing devices, or other devices cannot reliably detect the generated signals in one or more locations within the predetermined coverage area.

Still referring to FIG. 1, oscillators 110a-110c and/or 120a-120c may include or be communicatively coupled to one or more controllers, such as an electronic control unit ("ECU"). Controllers may receive signals from the oscillators 110a-110c and/or 120a-120c, and may instruct generation of signals by oscillators 110a-110c and/or 120a-120c. Received signals may be analyzed and appropriately processed by controllers. For instance, a wireless device such as an electronic key fob or a remote controller may transmit signals to one or more of the oscillators 110a-110c and/or 120a-120c to perform a particular action or to indicate presence of the key fob within a coverage area. Such actions may include, for instance, locking/unlocking a door, opening/closing a powered door or tailgate, triggering/terminating an alarm, allowing for actuating a motor or engine, or the like. It is noted that received signals may be analyzed to determine whether the key fob is authorized to perform an action, such as unlock a door. It is noted that vehicle 102 may include any number of appropriate oscillators that may be configured to control any number of actions for a vehicle.

Further, the vehicle 102 may include any appropriate make or model of vehicle. Such vehicles may include, for example, cars, trucks, recreation vehicles, vans, all-terrain vehicles, or the like. Moreover, vehicles may include combustion engines, electric motors, or hybrid power sources. In general, the placement and/or orientation of oscillators on or within the vehicle 102 may be predetermined for a particular make and model of vehicle 102. Moreover, coverage areas of the plurality of oscillators may be predetermined for a particular make and model of vehicle 102.

Referring now to FIG. 2, an example schematic of a testing system 100 including a testing device and a portion of the vehicle 102 is depicted. It is noted that other vehicles with different numbers of oscillators may be equipped with the same, similar, or different components as described herein. In at least some embodiments, the vehicle 102 may include a vehicle control system including an ECU 130 including a processor 132 and a non-transitory computer readable memory 134, a plurality of oscillators 120 (e.g., oscillators 110a-110c, 120a-120c), and a communication unit 170. These and other components of the vehicle 102 may be communicatively connected to each other via a communication bus 140.

The communication bus 140 may be formed from any medium that is capable of transmitting a signal such as, for example, conductive wires, conductive traces, optical waveguides, or the like. The communication bus 140 may also refer to the expanse in which electromagnetic radiation and their corresponding electromagnetic waves traverse. Moreover, the communication bus 140 may be formed from a combination of mediums capable of transmitting signals. In one embodiment, the communication bus 140 includes a combination of conductive traces, conductive wires, connectors, and buses that cooperate to permit the transmission of electrical data signals to components such as processors, memories, sensors, input devices, output devices, and communication devices. Additionally, it is noted that the term "signal" means a waveform (e.g., electrical, optical, magnetic, mechanical or electromagnetic), such as DC, AC, sinusoidal-wave, triangular-wave, square-wave, vibration, and the like, capable of traveling through a medium. As used herein, the term "communicatively coupled" means that coupled components are capable of exchanging signals with one another such as, for example, electrical signals via conductive medium, electromagnetic signals via air, optical signals via optical waveguides, and the like.

The ECU 130 may be any device or combination of components including a processor 132 and non-transitory computer readable memory 134. The processor 132 may be any device capable of executing the machine-readable instruction set stored in the non-transitory computer readable memory 134. Accordingly, the processor 132 may be an electric controller, an integrated circuit, a microchip, a computer, or any other computing device. The processor 132 is communicatively coupled to the other components of the vehicle 102 by the communication bus 140. Accordingly, the communication bus 140 may communicatively couple any number of processors 132 with one another, and allow the components coupled to the communication bus 140 to operate in a distributed computing environment. Specifically, each of the components may operate as a node that may send and/or receive data. It is further noted that the processor 132 may include a single processor, multiple processors, or a system of processors.

The non-transitory computer readable memory 134 may include RAM, ROM, flash memories, hard drives, or any non-transitory memory device capable of storing machine-readable instructions such that the machine-readable instructions can be accessed and executed by the processor 132. The machine-readable instruction set may include logic or algorithm(s) written in any programming language of any generation (e.g., 1 GL, 2 GL, 3 GL, 4 GL, or 5 GL) such as, for example, machine language that may be directly executed by the processor 132, or assembly language, object-oriented programming (OOP), scripting languages, microcode, etc., that may be compiled or assembled into machine readable instructions and stored in the non-transitory computer readable memory 134. Alternatively, the machine-readable instruction set may be written in a hardware description language (HDL), such as logic implemented via either a field-programmable gate array (FPGA) configuration or an application-specific integrated circuit (ASIC), or their equivalents. Accordingly, the functionality described herein may be implemented in any conventional computer programming language, as pre-programmed hardware elements, or as a combination of hardware and software components. It is noted that the non-transitory computer readable memory 134 may include one or more devices, memory modules, or the like.

Still referring to FIG. 2, the vehicle 102 may also include a plurality of oscillators 120, such as oscillators 110a-110c, and oscillators 120a-120c (FIG. 1). For example, and without limitation, the plurality of oscillators 120 may include wireless communication devices, such as transceivers that are capable of generating and/or receiving signals. The plurality of oscillators 120 may be utilized as key fob sensors, wireless device sensors, or the like. It is noted that the end use of the plurality of oscillators 120 is not limited. That is, the plurality of oscillators 120 may be tested for functionality regardless of how the plurality of oscillators 120 are to be used once a vehicle is produced or otherwise released for production. Signals generated by the plurality of oscillators 120 may be communicated to the ECU 130, to the testing device 202, or other devices. Additionally, the electronic control unit 130 may instruct one or more of the plurality of oscillators 120 to generate test signals during a testing process.

The non-transitory computer readable memory 134 may include unit testing logic 172 including instructions that, when executed by the processor 132, cause the processor 132 to execute testing of oscillators. For instance, the unit testing logic 172 may include instructions that cause the processor 132 to receive a test request from the testing device 202 via the communication unit 170. The unit testing logic 172 may identify one or more of the plurality of oscillators 120 to be tested and may instruct one or more selected oscillators of the plurality of oscillators 120 to generate predetermined test signals. For instance, the unit testing logic 172 may receive, via the communication unit 170, a test request such as from the testing device 202. The unit testing logic 172 may identify one or more the plurality of oscillators 120 for testing based on a specification of a selected sensor in the test request. The unit testing logic 172 can identify a test signal for the select sensor based on parameters stored in a memory device, such as non-transitory computer readable memory 134. The unit testing logic 172 may then instruct, via the communication bus 140, the select sensor to generate the test signal.

The testing device 202 may include an electronic device or computing device capable of wirelessly sending and receiving data. The testing device 202 may have a processor, a memory, a transceiver, an input, and an output. Examples of such devices include cellular telephones (e.g., smart phones), personal digital assistants (PDAs), portable computers, tablet computers (tablets), hand held gaming counsels, wearables (e.g., smart watches), of the like. In embodiments, the testing device 202 includes a user interface, such as a touch screen of a mobile device. The testing device 202 may include other user interfaces such as audible devices (e.g., speakers, microphones, etc.), visual indicators, (e.g., light emitting diodes (LED), etc.), or other user interfaces.

Figure 3:
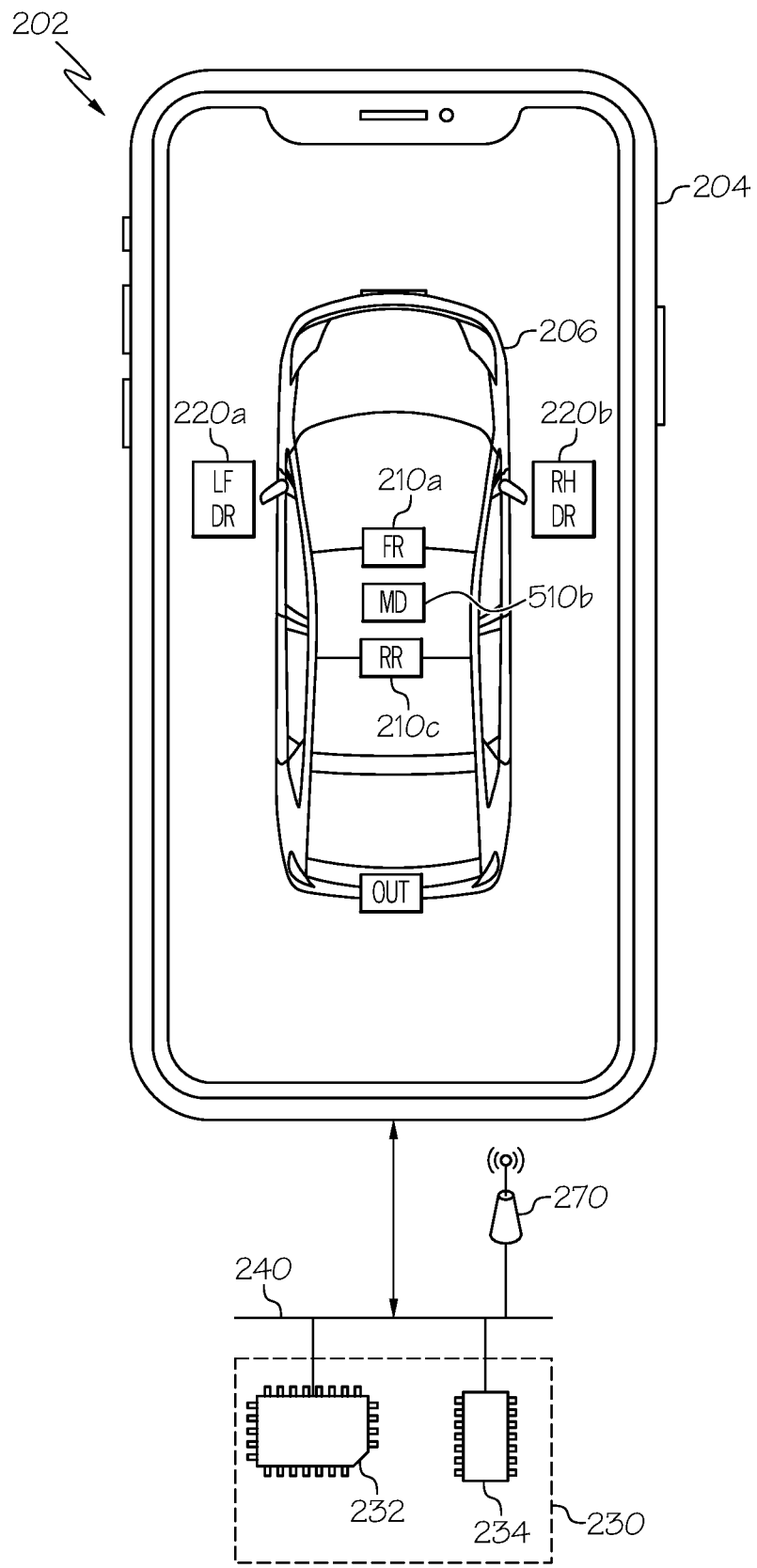
FIG. 3 depicts a schematic view of the testing device including a display device according to one or more aspects shown and described herein.

Turning to FIG. 3 with reference to FIG. 2, depicted is a schematic view of the testing device 202 including a display device 204. The testing device may include the display device 204 and a control unit 230 including a processor 232 and a non-transitory computer readable memory 234, and a communications unit 270. These and other components of the testing device 202 may be communicatively connected to each other via a communication bus 240. It is noted that liked named components of FIG. 2 and FIG. 3 may be similar. For instance, the processor 232 and the processor 132 may each include an electric controller, an integrated circuit, a microchip, a computer, or any other testing device. In embodiments, the computer readable memory 234 may store computer readable instructions that may be executed by the processor 232 to provide an application or "app". According to examples described herein, an application may include an oscillator testing application that instructs the display device 204 to display interface and receive input, and further enables testing processes of oscillators as described herein.

The communications unit 270 may include one or more devices configured to communicate over a network, for instance, a wireless network, broadband wide-area networks such as cellular networks, local-area networks, wireless local-area networks (e.g., Wi-Fi), and personal area networks, such as near-field communication networks including BLUETOOTH®. Moreover, the communications unit 270 may include an antenna configured to communicate over a predetermined frequency or frequency range, for example, a signal at a frequency of about 120-135 KHz. Accordingly, the communications unit 270 may be configured to receive signals from the oscillators of the oscillators 110a-110c and/or 120a-120c to perform testing operations.

In embodiments, the testing device 202 may display, via the display device 204, a graphical representation 206 of a vehicle 102 and a graphical representation 210a, 210b, 210c, 220a, 220b, and 220c of the plurality of, such as oscillators 110a-110c and 120a-120c of the vehicle 102 (FIG. 1). oscillators 110a-110c and 120a-120c of a vehicle in a user interface. The testing device 202 may identify locations to place the graphical representations 210a, 210b, 210c, 220a, 220b, and 220c on the graphical representation 206 of the vehicle 102 based on information stored within a memory device, such as computer readable memory 234 and/or via a remote storage device. The locations of the graphical representations 210a-210c and 220a-220c of the plurality of oscillators relative the graphical representation 206 of a vehicle 102 can correspond to actual physical locations of the physical sensors of a vehicle.

According to some embodiments, the testing device 202 access a database including a library of a plurality of vehicles identified by types (e.g., makes, models, etc.) with associated oscillator locations, expected operating parameters (e.g., performance metrics, coverage areas, etc.). Based on the vehicle type, the testing device 202 may determine locations on the representation 206 of the vehicle 102 at which to overlay the graphical representations 210a, 210b, 210c, 220a, 220b and 220c of the plurality of oscillators, which can include tokens or markers which indicate locations. In other embodiments, the testing device 202 may be programmed to render tokens or markers at predetermined locations on the representation of the vehicle 102.

The plurality of graphical representations 210a, 210b, 210c, 220a, 220b, and 220c may represent locations of physical oscillators on a vehicle, such as oscillators 110a-110c, 120a-120c of vehicle 102 (FIG. 1). For instance, the graphical representation 210a may represent oscillator 110a, which generally represents a front most cabin oscillator. The graphical representation 210b may represent oscillator 110b, which generally represents a middle cabin oscillator. The graphical representation 210c may represent oscillator 110c, which generally represents a rear most cabin oscillator. The graphical representation 220a may represent oscillator 120a, which generally represents a left front door oscillator. The graphical representation 220b may represent oscillator 120b, which generally represents a right front door oscillator. The graphical representation 220c may represent oscillator 110c, which generally represents a rear door oscillator. A user who desires to test one or more of oscillators 110a-110c, 120a-120c may select the corresponding location on the display device.

As shown in FIG. 2, the testing device 202 may communicate with the vehicle 102 via the communication unit 170 through the network 180. In embodiments, the testing device 202 may generate and transmit a test request to the ECU 130 of the vehicle 102, which identifies a selected oscillator of the plurality of oscillators 120 for testing in response to receiving input via the display device 204 (FIG. 3) identifying a select one of the plurality of oscillators 120. As an example, a user may touch a graphical representation 220a of a sensor via a touch screen of the display device 204. The testing device 202 can received the input and identify that the oscillator 120a is to be tested. The testing device 202 may then generate a test request that identifies the selected oscillator 120a and/or oscillator of the selected oscillator 120a to be tested (e.g., left front door oscillator 120a, etc.). The ECU 130 can receive, via the communication unit 170, the test request and instruct an appropriate oscillator to generate test signals. The test signal can include a pulse with modulation signal having predetermined parameters (e.g., frequency, modulation pattern, etc.) or other appropriate signals having predetermined, controllable, and measurable parameters. The selected oscillator of the plurality of oscillators 120 may generate the test signal for a duration of time, such as for a predetermine duration, until a user indicates a test is complete, a user selects a different oscillator for testing, or until another triggering event occurs.

As the selected oscillator generates the test signal, the testing device 202 can receive or attempt to receive this test signal. The testing device 202 may calculate a performance metric of test signals as they are received from the selected oscillator to determine whether the selected oscillator is at least one of properly placed, functioning at a predetermined threshold, or both. In examples, a user may place the testing device 202 at various locations within a predetermined coverage area, such as coverage area 124a (FIG. 1). The locations within the predetermined coverage area for the selected oscillator may be identified by the testing device 202 and displayed on the display device 204. For instance, based on the make and model of the vehicle and/or the select oscillator, the testing device 202 may identify a plurality of orientations and locations for the testing device 202 to be placed for receiving the test signals. Additionally or alternatively, physical markers may be provided in a testing facility, such as on a floor, on a sign, or the like. It is noted that the user may provide input indicating that the testing device 202 is at a determined location and/or the testing device may determine locations via one or more sensors, such as proximity sensors, wireless sensors (e.g., NFC sensors), or the like. In at least some embodiments, the testing device 202 may provide real-time instructions to a user which identify a particular direction or orientation in which a user is to move or place the testing device. The instructions may be displayed on the display device 204, via an audio output device (e.g., speaker), or otherwise communicated via a user interface device.

Still referring to FIG. 2, the testing device 202 may calculate a performance metric of test signals received from the selected oscillator to determine whether the selected oscillator is at least one of properly placed, functioning at a predetermined threshold, or both. In an example, the testing device 202 may determine the performance metric of the testing signals based on evaluating the pulse with modulation signals. The performance metric can include a signal strength, a signal reliability (e.g., whether the signal is repeatedly received, whether the signal is interrupted, etc.), standard receiving rate of the test signals, sampling rates of the test signals, or other metrics. If the selected oscillator does not provide a test signal at a predetermined threshold relative a location of the testing device 202 within a cover area, the testing device 202 may determine that the selected oscillator is at least one of properly placed, functioning at a predetermined threshold, or both. For example, in testing of the oscillator 120a, if the testing device 202 does not receive a test signal at a point along the parameter of the coverage area 124a as defined by the coverage radius 122a, the testing device 202 may determine that the oscillator 120a has a coverage area that is shifted from a predetermined coverage area, which may indicate that the oscillator 120a is not properly functioning, is defective, is not in a proper orientation, and/or is not at a proper location. In at least some embodiments, the testing device 202 may determine at least one of a change of location or a change of an orientation for the selected oscillator based on the performance metric, such that a cover area of the selected oscillator is improved or corrected.

According to an embodiment, the testing device 202 can determine orientations and locations of the testing device 202. The testing device 202 can determine whether it is appropriately oriented and located to receive test signals based on a predetermined set of locations and/or orientations. For instance, based on the orientation and/or location, the testing device 202 may determine whether an orientation or location should be altered for measurement of test signals. In examples, the testing device 202 can include a mobile testing device, such as a cellular phone or a tablet computer. Such devices may include sensors, such as accelerometers, inertial sensors, or other components that may detect an orientation of the testing device 202 relative earth's normal. In some examples, a cellular phone or a tablet computer includes cameras, proximity sensors, or other components that may determine relative locations of the testing device 202 to the vehicle 102. Moreover, the testing device 202 may transmit secondary test signals to the ECU 130 of the vehicle 102 to that identifies a change in a location of the testing device 202. In response, the ECU 130 may instruct a selected oscillator to generate test signals to be received by the testing device 202.

It is noted that the testing device 202 can be configured to transmit performance metrics and/or test results to a remote computer, such as a server. The server may aggregate testing results, identify vehicles 102 which may need repair or modification, or may otherwise monitor testing of vehicles.

Testing of the plurality of oscillators 120 (e.g., oscillators 110a-110c, 120a-120c) may be iterated such that each oscillator is individually tested. In some other tests, sets of the plurality of oscillators 120 may be tested together. For instance, oscillators 110a-110c may be individually tested and collectively tested to access the coverage area 112 (FIG. 1) within the cabin. It is noted that the plurality of oscillators 120 may be tested in any appropriate order, in any appropriate combinations, at appropriate times, and at varying distances from the testing device 202.

Accordingly, oscillators of vehicles can be tested via a testing device that is easily operated, flexible in use, and which produced reliable results. Complicated and expensive testing equipment may be eliminated or otherwise may not be required.

Figure 4:
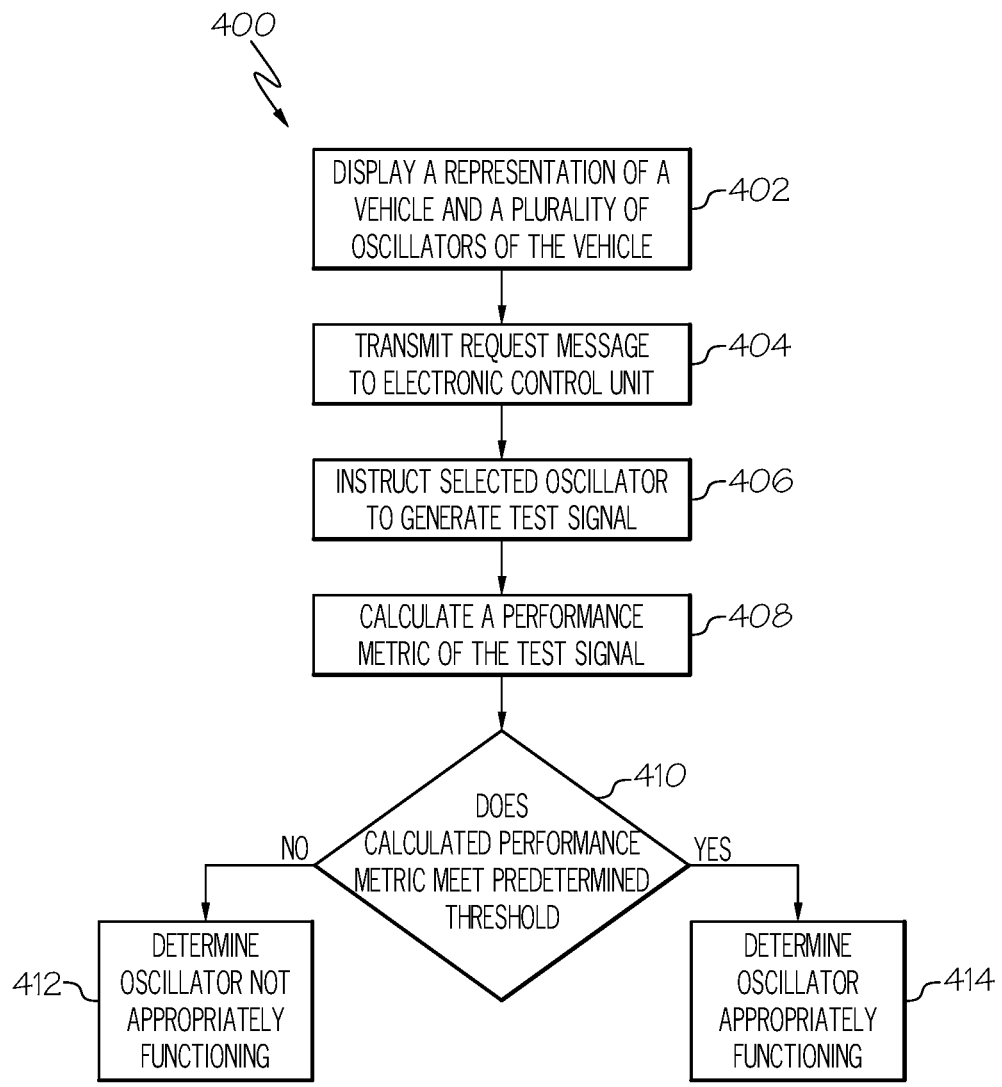
FIG. 4 depicts a block diagram of an illustrative method of testing of vehicle oscillators with a testing device according to one or more aspects shown and described herein.

Turning to FIG. 4, a method 400 of testing of vehicle oscillators with a testing device will now be described. It should be understood that the order of the process described herein with respect to FIG. 4 is merely illustrative, and that the present disclosure is not limited to the order described herein. An illustrative example of a particular ordering of steps will be described herein, but the present disclosure is not limited to such an example.

Referring to FIG. 4, at block 402 a system can display, via a display screen, a representation of a vehicle and a plurality of oscillators of the vehicle. The representation of the vehicle may be overlaid with graphical representations or markers of locations of sensors. The graphical representations of the locations of the sensors may correspond to the physical locations of a plurality of sensors (e.g., the plurality of oscillators 120 (FIG. 2)) on the physical vehicle (e.g., vehicle 102 (FIG. 1)). This may allow a user to easily identify an oscillator for testing. In examples, a system can display prompts to a user identifying coverage areas for a selected oscillator, locations and/or orientations at which to place a testing device, prompts, or other information. For instance, a display can identify where and at what orientation a user should hold a cellular phone for testing. The user can provide input identifying that the cellular phone is at an appropriate location and testing may commence. In some embodiments, the cellular phone may automatically detect a proper location through image recognition of the vehicle and/or testing facility, geolocation of the cellular phone, or via other appropriate location identifying processes, At block 404, a system can transmit a request message to an ECU of a vehicle. For example, the testing device 202 generates a wireless signal that is to be received via a communication unit 170 of the vehicle 102 (FIG. 2). The testing device 202 sends the signals through network 180. For instance, the system can transmit a test request that identifies a selected oscillator for testing from the plurality of oscillators in response to receiving input selecting the selected oscillator. The selected oscillator may be identified by a user providing input to a display screen, providing voice or gesture input, or otherwise identifying the oscillator.

At block 406, the system can instruct, via an ECU of a vehicle, the selected oscillator to transmit a test signal. The test signal can include a predetermined signal having predetermined parameters to allow a testing device to detect the test signal. For instance, the test signal can include a pulse width modulated signal having a predetermined frequency, modulation pattern, or other characteristics.

At block 408, the system can calculate a performance metric of the test signal transmitted by the selected oscillator to determine whether the selected oscillator is at least one of properly placed, functioning at a predetermined threshold, or both. For instance, a testing device can measure intensity of a signal, sampling rates, standard receiving rate of the test signals, identify lack of a test signal, or other metrics.

In a non-limiting example, the testing device 202 may determine the performance metric as a receiving rate or frequency of detections of signals from a selected oscillator of a sensor at a predetermined location over a predetermined amount of time. A higher relative frequency of detection may be indicative of a stronger signal and a lower relative frequency of detection may be indicative of a weaker signal. Moreover, various embodiments may include the testing device 202 configured to determine a performance metric as an intensity of a received signal or a received signal strength indication (RSSI) to measure estimated power levels of received signals by the testing device 202 from a selected oscillator or a sensor. In examples, the testing device 202 may utilize Fourier transforms (e.g., Fast Fourier Transforms (FFT)) applied to received signals to determine peak detection, where relative heights of detected peaks may be used as a performance metric to estimate signal strength. It is noted that other appropriate methods of determining a transmission power, signal strength, signal reception rate, or the like may be utilized.

At block 410, the system can determine whether a calculated performance metric meets a predetermined threshold.

In embodiments, the testing device 202 or a remote testing device can compare the performance metric to a predetermined threshold to determine whether the measured performance metric meets expectations. As a non-limiting example, the testing device 202 can compare the may compare a predetermined transition power of the selected oscillator of the selected sensor to the measured power level of the received signal. In other examples, the testing device 202 can compare a calculated RSSI to a predetermined RSSI, which may serve as a threshold to indicate connection quality with the selected oscillator. Accordingly, the system can determine whether the performance metric meets expectations throughout a predetermined coverage area.

If the performance metric is determined not to meet the predetermined threshold, method 400 may proceed to block 412 where the system can determine that an oscillator of a selected sensor is not appropriately functioning. If the performance metric does not meet expectations throughout the predetermined coverage area, the system may determine that the oscillator is at least one of properly placed, functioning at a predetermined threshold, defective, or a combination thereof. In some embodiments, the system may identify modifications of oscillator locations and/or orientations to correct or improve a coverage area. In some embodiments, the system may identify modifications of oscillator locations and/or orientations to correct or improve a coverage area. The testing device 202 may transmit test results to a remote computing device, display test results via display device 204, store test results in a memory device, or otherwise process the test results. As an example, the testing device 202 can transmit a test result to a remote computing device to identify that the oscillator is at least one of not properly placed or oriented, is not functioning at a predetermined threshold, is defective, or a combination thereof. A technician may then adjust the oscillator and testing of the oscillator may be performed again. This process may be iterated until the method can proceed to block 414.

If the performance metric is determined to meet the predetermined threshold, method 400 may proceed to block 414 where the system can determine that an oscillator of a selected sensor is appropriately functioning. For instance, the testing device 202 or a remote testing device can compare the performance metric to a predetermined threshold to determine that the calculated performance metric meets expectations. As a non-limiting example, the testing device 202 can compare a predetermined transition power of the selected oscillator of the selected sensor to the measured power level of the received signal, compare a calculated RSSI to a predetermined RSSI, or compare other performance metrics to a predetermined threshold. Accordingly, the system can determine that the performance metric meets expectations throughout a predetermined coverage area, which indicates that the selected oscillator of a sensor is in a proper orientation, proper locations, and/or is otherwise functioning according to design. The testing device 202 may transmit test results to a remote computing device, display test results via display device 204, store test results in a memory device, or otherwise process the test results. As an example, the testing device 202 can transmit a test result to a remote computing device to identify that the oscillator is at least one of properly placed, functioning at a predetermined threshold, or a combination thereof.

It should now be understood that the testing system include a testing device configured to determine whether the selected oscillator is at least one of properly placed, functioning at a predetermined threshold, or both based on calculated performance metrics of signals generated by oscillators of a vehicle. The testing systems described herein provide for a display that displays a representation of a vehicle and a plurality of oscillators of the vehicle at associated locations of a physical vehicle. The testing systems can provide for flexible use, ease of use, and a robust testing platform.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A testing device, comprising:
   a processor configured to:
   display, via a display screen, a representation of a vehicle and a plurality of oscillators of the vehicle;
   transmit a test request that identifies a user-selected oscillator of the plurality of oscillators for testing in response to receiving an input via the display screen; and
   calculate a performance metric of test signals received from the user-selected oscillator to determine whether the user-selected oscillator is at least one of properly placed and functioning at a predetermined threshold.

2. The testing device of claim 1, wherein the testing device is further configured to determine at least one of a location to which the user-selected oscillator should be changed or an orientation to which the user-selected oscillator should be changed based on the performance metric.

3. The testing device of claim 1, wherein the testing device is further configured to identify the user-selected oscillator as defective based on the performance metric.

4. The testing device of claim 1, wherein the testing device is further configured to identify an orientation and location for the testing device, and for determining whether the orientation should be altered to receive the test signals.

5. The testing device of claim 1, wherein the testing device is further configured to identify a plurality of orientations and locations for the testing device to be placed for receiving the test signals, and generating instructions indicating movement of the testing device to the plurality of orientations and locations.

6. The testing device of claim 5, wherein the test signals comprise pulse with modulation signals, and wherein the testing device is further configured to determine the performance metric of the test signals based on evaluating the pulse with modulation signals.

7. The testing device of claim 5, wherein the testing device is further configured to transmit a secondary test signal that identifies a change in a location of the testing device.

8. The testing device of claim 1, wherein the testing devices comprises at least one of a cellular phone or a tablet computer.

9. The testing device of claim 1, wherein the testing device is further configured to transmit the performance metric to a remote computer.

10. The testing device of claim 1, wherein the testing device identifies the representation of the vehicle and the plurality of oscillators of the vehicle from a vehicle library comprising a plurality of vehicles and associated oscillators.

11. The testing device of claim 1, wherein the representation of the vehicle and the plurality of oscillators of the vehicle includes selectable graphical tokens identifying a plurality of locations of the plurality of oscillators relative the vehicle, wherein the graphical tokens correspond to physical locations on the vehicle.

12. The testing device of claim 1, wherein the plurality of oscillators includes at least one of a left front door oscillator, a right front door oscillator, a rear door oscillator, or a cabin oscillator.

13. A method, comprising:
   displaying, via a display screen, a graphical representation of a vehicle and a graphical representation of a plurality of oscillators of the vehicle;
   transmitting a test request that identifies a user-selected oscillator of the plurality of oscillators in response to receiving input selecting the user-selected oscillator;
   instructing, via an electronic control unit of the vehicle, the user-selected oscillator to transmit a test signal; and
   calculating a performance metric of the test signal transmitted by the user-selected oscillator to determine whether the user-selected oscillator is at least one of properly placed and functioning at a predetermined threshold.

14. The method of claim 13, further comprising receiving the test signals, via a testing device, at a plurality of locations within a predetermined coverage area for the user-selected oscillator.

15. The method of claim 14, further comprising identifying the plurality of locations within the predetermined coverage area for the user-selected oscillator.

16. The method of claim 15, further comprising wherein identifying the plurality of locations includes at least one of displaying an image of the predetermined coverage area via the display screen or providing physical markers in a testing facility.

17. A testing system, comprising:
   a testing device, configured to display, via a display screen, a representation of a vehicle and a plurality of oscillators of the vehicle, and transmit a test request that identifies a user-selected oscillator of the plurality of oscillators for testing in response to receiving input via the display screen; and
   a vehicle comprising a communication unit communicatively coupled to an electronic control unit, wherein the electronic control unit is configured to receive, via the communication unit, the test request, and instruct the user-selected oscillator to generate test signals,
   wherein the testing device is further configured to calculate a performance metric of the test signals received from the user-selected oscillator to determine whether the user-selected oscillator is at least one of properly placed, functioning at a predetermined threshold, or both.

18. The testing system of claim 17, wherein the representation of the vehicle and the plurality of oscillators of the vehicle includes tokens identifying a plurality of locations of the plurality of oscillators relative the vehicle.

19. The testing system of claim 18, wherein the plurality of oscillators includes at least one of a left front door oscillator, a right front door oscillator, a rear door oscillator, or a cabin oscillator.

20. The testing device of claim 17, wherein testing device further comprises at least one of a cellular phone or a tablet computer.

\* \* \* \* \*